United States Patent [19]
Cline et al.

[11] 3,988,764
[45] Oct. 26, 1976

[54] DEEP DIODE SOLID STATE INDUCTOR COIL

[75] Inventors: Harvey E. Cline; Thomas R. Anthony, both of Schenectady, N.Y.

[73] Assignee: General Electric Company, Schenectady, N.Y.

[22] Filed: Apr. 23, 1975

[21] Appl. No.: 570,661

Related U.S. Application Data

[63] Continuation of Ser. No. 411,000, Oct. 30, 1973, abandoned.

[52] U.S. Cl. .................... 357/51; 357/60; 357/76; 357/88; 357/89; 357/90; 148/1.5
[51] Int. Cl.² .............. H01L 7/00; H01L 27/02; H01L 29/04; H01L 23/32
[58] Field of Search ............... 357/60, 76, 88, 89, 357/90, 51

[56] References Cited
UNITED STATES PATENTS

| | | | |
|---|---|---|---|
| 2,813,048 | 11/1957 | Pfann | 357/60 |
| 3,582,727 | 6/1971 | Granger et al. | 357/60 |
| 3,614,554 | 10/1971 | Shield et al. | 357/60 |

Primary Examiner—Edward J. Wojciechowicz
Attorney, Agent, or Firm—Donald M. Winegar; Joseph T. Cohen; Jerome C. Squillaro

[57] ABSTRACT

An array of columnar structures are provided in a body of semiconductor material. The material of each columnar structure is recrystallized material of the body having solid solubility of a dopant metal therein. Means are provided for connecting the columnar structures into a series electrical arrangement with each other to form a solid state inductor for integral circuits.

28 Claims, 6 Drawing Figures

DEEP DIODE SOLID STATE INDUCTOR COIL

This is a continuation of application Ser. No. 411,000, filed Oct. 30, 1973, and now abandoned.

BACKGROUND OF THE INVENTION

1. Field of the Invention

This invention relates to inductors for integrated circuits and a process for making the same.

2. Description of the Prior Art

Heretofore, solid state induction coils have not been employed in integrated circuits because of fabrication limitations. Circuit and chip designers employ a variety of circuits which enable them to design around this process limitation.

An object of this invention is to provide a solid state induction coil for integrated circuits.

Another object of this invention is to provide a process for making a solid state induction coil.

Other objects of this invention will, in part, be obvious and will, in part, appear hereinafter.

BRIEF DESCRIPTION OF THE INVENTION

In accordance with the teachings of this invention, there is provided a solid state inductor. The inductor comprises a body of single crystal semiconductor material having first and second major opposed surfaces, a selected resistivity and a first type conductivity. A plurality of regions of second and opposite type conductivity and a selected resistivity are disposed in the body. Each region extends between, and terminates in, the two major opposed surfaces of the body and has two opposed end surfaces. Each of the two opposed end surfaces is coextensive with only one of the major surfaces. The material of each of the regions is recrystallized semiconductor material of the body having solid solubility of a material therein to impart the second type conductivity and selective level of resistivity thereto. Each of the regions is a low resistance electrical path for conducting electrical currents between the opposed surfaces of the body. A P-N junction is formed by the contiguous surfaces of the materials of each region and the body. Means are provided for electrically connecting the plurality of regions into a series circuit arrangement to function as an electrical coil when conducting electricity.

DESCRIPTION OF THE INVENTION

Figure 1:
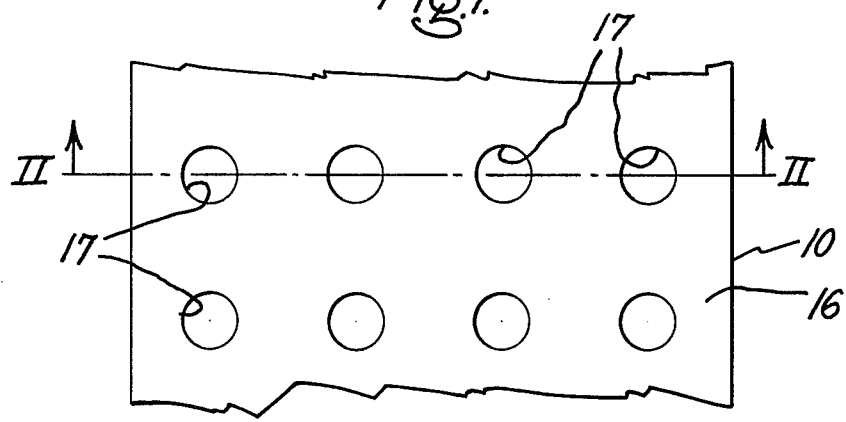
FIG. 1 is a top planar view of a body of semiconductor material being processed in accordance with the teachings of this invention.
Figure 2:
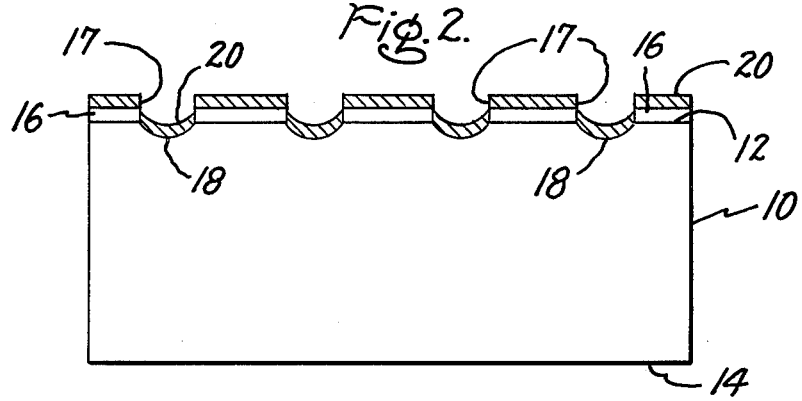
FIG. 2 is an elevation view, in cross-section, of the body of FIG. 1 taken along the cutting plane II—II.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of Group II element and a Group VI element, and a compound of a Group III element and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for exammple, as Kodak Metal Etch Resist, is disposed on the surface of the silicon oxide layer 16. The resist is dried by baking at a temperature of about 80° C. A suitable mask defining one or more geometrical shapes such, for example, as a circle or a square is disposed on the layer of photoresist and exposed to ultraviolet light. After exposure, the layer of photoresist is washed in Xylene to open windows in the mask where the lines are desired so as to be able to selectively etch the silicon oxide layer 16 exposed in the windows.

Selective etching of the layer 16 of silicon oxide is accomplished with a buffered hydrofluoric acid solution ($NH_4F$-HF). The etching is continued until a second set of windows 17 corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a solution of 1 part of hydrogen peroxide and 1 part of concentrated sulphuric acid immediately after mixing.

Selective etching of the exposed surface of areas of body 10 is accomplished with a mixed acid solution. The mixed acid solution is 10 parts by volume nitric acid 70%, 4 parts by volume acetic acid, 100%, and 1 part by volume hydrofluoric acid, 48%. At a temperature of from 20° C to 30° C, the mixed acid solution selectively etches the silicon of the body 10 at a rate of approximately 5 microns per minute. A depression 18 is etched in the surface 12 of the body 10 beneath each window 17 of the oxide layer 16. The selective etching is continued until the depth of the depression 18 is approximately equal to the diameter or width of the window 17 in the silicon oxide layer 16. However, it has been discovered that the depression 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a depression 18 of from 25 to 30 microns in depth for a window 17 of a diameter or width of from 10 to 500 microns. The etched body 10 is rinsed in distilled water and blown dry. Preferably, a gas such, for example, as freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the depressions 18. The metal in the depressions 18 are the metal "drops" to be migrated through the body 10. The metal of the layer 20 comprises a material, either substantially pure in itself or suitably doped by one or more materials to impart a second and opposite type conductivity to the materials of the body 10 through which it migrates. The thickness of the layer 20 is approximately equal to the depth of the depressions 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding away the excess metal with a 600 grit carbide paper or by selective etching.

It has been discovered that the vapor deposition of the layer 20 of aluminum metal should be performed at a pressure of approximately $1 \times 10^{-5}$ torr but not greater than $5 \times 10^{-5}$ torr. When the pressure is greater than $3 \times 10^{-5}$ torr, we have found that in the case of aluminum metal deposited in the depression 18, the aluminum does not penetrate into the silicon and migrate through the body 10. It is believed that the layer of aluminum is saturated with oxygen and prevents good wetting of the contiguous surfaces of silicon. The initial melt of aluminum and silicon required for migration is not obtained because of the inability of aluminum atoms to diffuse into the silicon interface. In a like manner, aluminum deposited by sputtering is not desirable as the aluminum appears to be saturated with oxygen from the process. The preferred methods of depositing aluminum on the silicon body 10 are by the electron beam method and the like wherein little if any oxygen can be trapped in the aluminum.

Figure 3:
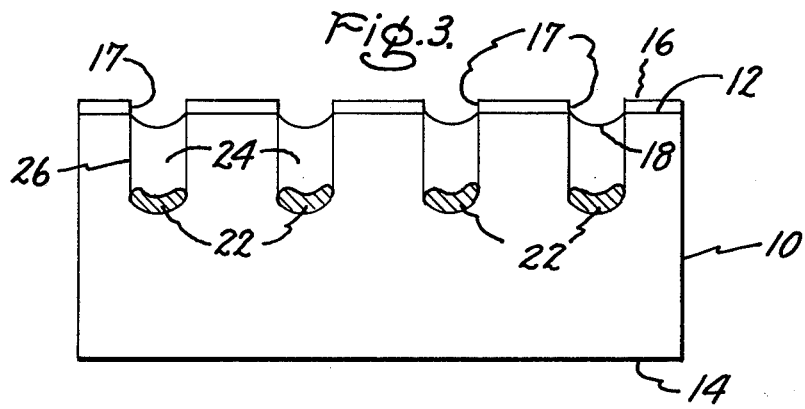
FIGS. 3 and 4 are elevation views, in cross-section, of the body of FIGS. 1 and 2 being processed further in accordance with the teachings of this invention.
Figure 4:
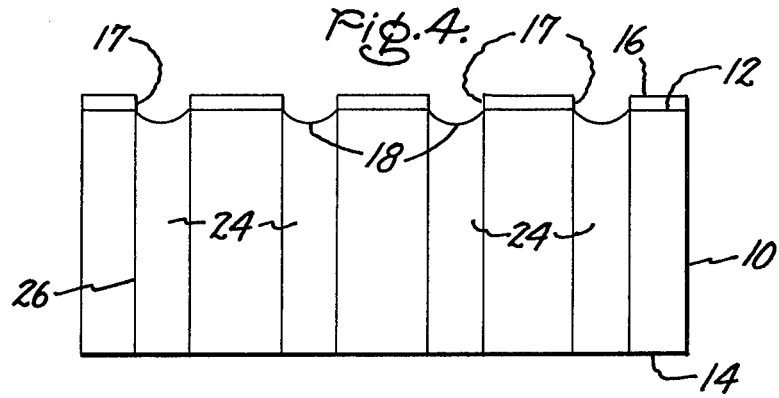

Referring now to FIG. 3, the processed body 10 is placed in a thermomigration apparatus, not shown, and the metal in the depressions 18 forms droplet 22 of metal-rich alloy of the material of the body 10 in each etched area of surface 12 and is thermomigrated through the body 10 by a thermal gradient zone melting process. A thermal gradient of approximately 50° C per centimeter between the bottom surface 14, which is the hot face, and the surface 12, which is the cold face, has been discovered to be appropriate for an average temperature of the body 10 of from 700° C to 1350° C. The process is practiced for a sufficient length of time to migrate the metal-rich droplet 22 through the body 10. For example, for aluminum metal of 20 microns thickness, a thermal gradient of 50° C/centimeter, a temperature of the body 10 of 1100° C, a pressure of $1 \times 10^{-5}$ torr, a furnace time of less than 12 hours is required to migrate the metal-rich droplet 22 through a silicon body 10 of 1 centimeter thickness. The completed structure after processing is shown in FIG. 4.

The thermomigration of the droplet 22 forms a region 24 of recrystallized material of the body 10 having solid impurity of the metal 20 therein. The conductivity type of the material of the region 24 is of a different and opposite type thereby forming a P-N junction 26 by the contiguous surfaces of the materials of opposite type conductivity. The resistivity of the region 24 is dependent on the metal thermomigrated through the body 10.

It has been discovered that when the body 10 is of silicon, germanium, silicon carbide, gallium arsenide, semiconductor material and the like, the droplet 22 has a preferred shape which also gives rise to the region 24 being of the same shape as the droplet 22. In a crystal axis direction of <111> of thermal migration, the droplet 22 migrates as a triangular platelet laying in a (111) plane. The platelet is bounded on its edges by (112) planes. A droplet 22 larger than 0.10 centimeter on an edge is unstable and breaks up into several droplets during migration. A droplet 22 smaller than 0.0175 centimeter does not migrate into the body 10 because of a surface barrier problem.

The ratio of the droplet migration rate over the applied thermal gradient is a function of the temperature at which thermomigration of the droplet 22 is practiced. At high temperatures, of the order of from 1100° C to 1400° C, the droplet migration velocity increases rapidly with increasing temperature. A velocity of 10 centimeters per day of $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet 22 thermomigrates in the <100> crystal axis direction as a pyramid bounded by four forward (111) planes and a rear (100) plane. Careful control of the thermal gradient and migration rate is a necessity. Otherwise, a twisted region 24 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted into a trapezoidal shape.

For a more thorough understanding of the temperature gradient zone melting process and the apparatus employed for the process, one is directed to our co-pending applications entitled Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008; filed concurrently with this patent application and assigned to the same assignee of this invention.

The regions of recrystallized material exhibits substantially theoretical physical values depending upon the materials involved. Various materials may be migrated into the body 10 to provide various resistivities and conductivity types therein.

Upon completion of the thermomigration of the metal droplets 22 to form the columnar array, selective etching and the like is employed to remove the remaining layer 16 of silicon oxide and any damaged material from the surface 12. The surface 12 may be processed to remove material to eradicate the depressions 18. Alternatively, the depressions 18 may be left in the surface 12.

Figure 5:
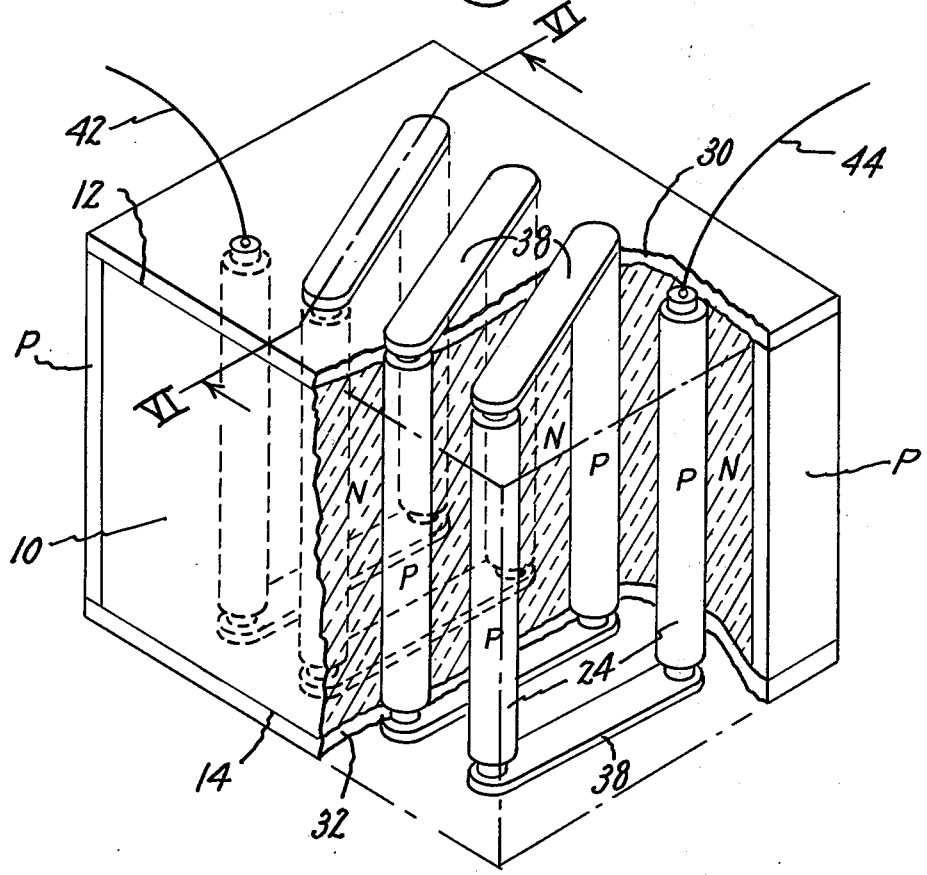
FIG. 5 is an isometric view, partly in cross-section, of the solid state induction coil made in accordance with the teachings of this invention.
Figure 6:
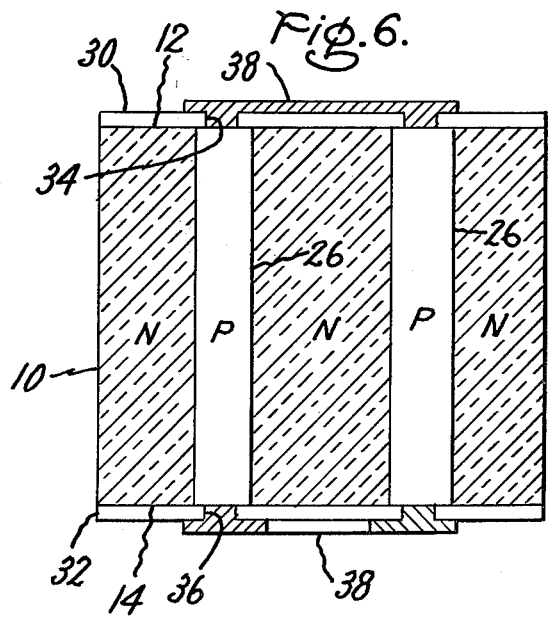
FIG. 6 is an elevation view, in cross-section, of the induction coil of FIG. 5 taken along the cutting plane VI—VI.

Referring now to FIGS. 5 and 6, layers 30 and 32 of an electrically insulating material such, for example, as silicon oxide, silicon nitride, aluminum oxide and the like are disposed on the respective surfaces 12 and 14 of the processed body 10 by any of the methods well known to those skilled in the art. Employing photolithographical techniques and selective etching well known to those skilled in the art, windows 34 and 36 are opened in the respective layers 30 and 32 to expose selective end surface areas of each region 24. The exposed portions of the P-N junctions 26 in the surfaces 12 and 14 are still protected by the respective insulating layers 30 and 32. Again employing photolithographical techniques and selective etching a plurality of electrical contacts 38 comprising a suitable metal such, for example, as tin, aluminum, gold and the like are disposed on the respective layers 30 and 32 and exposed end surfaces of the regions 24 therein and so arranged as to produce a simple or complex solid state helical coil 40 in the body 10. Electrical leads 42 and 44 may be affixed to the opposite ends of the coil 40 to enable the coil 40 to be connected into electrical circuitry external to it.

When employed in integrated circuits and the like, it is preferred that solid state Junctions 40 be electrically isolated from the other electrical devices in the common substrate which they share. Therefore, with reference to FIG. 5 again, and embodying the process of thermomigration of metal wires in a manner similar to the thermomigration of the metal droplets 22, an electrically insulating grid comprising P-type conductivity regions 46 and accompanying P-N junctions 48 is formed in the body 10. The grid comprises regions 46 which may extend the full width and depth of the body 10 or a plurality of intersecting planar regions 46 may be employed to electrically isolate the coil 40 from the remainder of the electrical circuits formed in the body 10. For a more thorough discussion of electrical isolation grids and process of making the same, one is directed to the following copending applications, which are filed on the same day of this patent application and assigned to the same assignee, entitled Isolation Juunctions With Semiconductor Devices, Ser. No. 411,012 and Thermomigration of Metal-Rich Liquid Wires Through Semiconductor Materials, Ser. No. 411,018.

The thermomigration of metal wires to form an electrical isolation grid is preferably practiced in accordance with the planar orientations, thermomigration directions, stable wire directions and stable wire sizes of Table I.

Table I

| Wafer Plane | Migration Direction | Stable Wire Directions | Stable Wire Sizes |
|---|---|---|---|
| (100) | <100> | <011>* | <100 microns |
| | | <0$\bar{1}$1>* | <100 microns |
| (110) | <110> | <1$\bar{1}$0>* | <150 microns |
| (111) | <111> | a) <01$\bar{1}$> | |
| | | <10$\bar{1}$> | <500 microns |
| | | <1$\bar{1}$0> | |
| | | b) <11$\bar{2}$>* | |
| | | <$\bar{2}$11>* | <500 microns |
| | | <1$\bar{2}$1>* | |
| | | c) Any other* Directions in (111) plane* | <500 microns |

*The stability of the migrating wire is sensitive to the alignment of the thermal gradient with the <100>, <110> and <111> axis, respectively.
+Group a is more stable than group b which is more stable than group c.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

We claim as our invention:

1. A solid state inductor coil comprising
a body of semiconductor material having a predetermined first type conductivity, a predetermined level of resistivity, and a preferred crystallographic structure;
two major opposed surfaces being, respectively, the top and bottom surfaces of the body, at least one of the major surfaces having a preferred planar crystal orientation which is one selected from the group consisting of (111), (110) and (100);
a vertical axis which is substantially aligned parallel with a first preferred crystal axis of the material of the body;
an array of regions of second and opposite type conductivity disposed in the body;
each region of second type conductivity extending between, and terminating in, the two opposed major surfaces, and having two opposed end surfaces, each end surface being coextensive with a respective one of the major surfaces, and a longitudinal axis aligned substantially parallel with the vertical axis of the body;
the material of each second region consisting of recrystallized semiconductor material of the body formed in situ by the migration of a melt of metal-rich semiconductor material of the body through the entire body from one opposed major surface to the other by thermal gradient zone melting at a predetermined elevated temperature along a thermal gradient substantially parallel with the first preferred crystal axis and the vertical axis of the body and having a predetermined level of concentration of the metal of the melt distributed substantially uniformly throughout the entire region, the level of concentration of the metal being determined by the solid solubility limit of that metal in that semiconductor material at that predetermined elevated temperature of migration, the metal comprising at least one dopant impurity material for imparting the type conductivity and a predetermined level of resistivity to the recrystallized material of the region;
each second region being a path for conducting electrical currents between the opposed major surfaces of the body;
a P-N junction formed by the contiguous surfaces of the material of each region and the abutting material of the body, a portion of the junction being exposed at the opposed major surfaces, and
means for electrically connecting the array of regions into a series electrical circuit arrangement to function as an inductor coil.

2. The solid state inductor coil of claim 1 wherein the preferred planar crystal orientation is (111), and the cross-section of each second region has a triangular-like configuration.

3. The solid state inductor coil of claim 1 wherein the preferred planar crystal orientation is (100), and the cross-section of each second region has a square-like configuration.

4. The solid state inductor coil of claim 1 wherein the semiconductor material is one selected from the group consisting of silicon, silicon carbide, germanium and gallium arsenide.

5. The solid state inductor coil of claim 4 wherein the material of the body is silicon having N-type conductivity, and
the dopant impurity material is aluminum.

6. The solid state inductor coil of claim 1 wherein the preferred planar crystal orientation is (111), and each region of second type conductivity has a triangular-like cross-sectional configuration.

7. The solid state inductor coil of claim 6 wherein the semiconductor material of the body is silicon, and the dopant material is aluminum.

8. The solid state inductor coil of claim 1 wherein the preferred planar crystal orientation is (100), and each region of second type conductivity has a rectangular-like cross-sectional configuration.

9. The solid inductor coil of claim 8 wherein the semiconductor material of the body is silicon, and the dopant impurity material is aluminum.

10. The solid state inductor coil of claim 1 and including
    at least one electrical isolation region disposed in the body and electrically isolating the solid state inductor from the remainder of the material of the body, each region having second type conductivity and extending between, and terminating in, the opposed major surfaces;
    the material of each of the isolation regions consisting of recrystallized semiconductor material of the body formed in situ by the migration of a melt of metal-rich semiconductor material of the body through the entire body from one opposed major surface to the other by thermal gradient zone melting at a predetermined elevated temperature along a thermal gradient substantially parallel with the first preferred crystal axis and the vertical axis of the body and having a predetermined level of concentration of the metal of the melt distributed substantially uniformly throughout the entire region, the level of concentration of the metal being determined by the solid solubility limit of that metal in that semiconductor material at that predetermined elevated temperature of migration, the metal comprising at least one dopant impurity material for imparting the second type conductivity and a predetermined level of resistivity to the recrystallized material of the region;
    each of the isolation regions having a vertical axis aligned substantially parallel with the first crystal axis of the material of the body, and
    a P-N junction formed by the contiguous surfaces of the material of each of the isolation regions and the abutting material of the body, a portion of the junction being exposed at the opposed major surfaces.

11. The solid state inductor coil of claim 10 wherein the electrical isolation region comprises a plurality of intersecting planar regions encompassing a selected portion of the body in which the solid state inductor coil is disposed, and
    each planar region of the isolation region is oriented substantially parallel with a second crystal axis of the material of the body for a preferred planar crystal orientation of the at least one major surface.

12. The solid state inductor coil of claim 11 in which the preferred planar crystal orientation of the at least one major surface is one selected from the group consisting of (100) and (111),
    the electrical isolation region consists of two sets of a pair of spaced planar regions, each region of each set being substantially parallel to the other region and substantially perpendicular to each region of the other set of planar regions and the opposed major surfaces of the body and intersecting each region of the other set of regions at substantially a right angle.

13. The solid state inductor coil of claim 12 in which the preferred planar crystal orientation is (111),
    the second crystal axis of one set of planar regions is one selected from the group consisting of $<11\bar{2}>$, $<\bar{2}11>$ and $<1\bar{2}1>$, and
    the second crystal axis of the planar regions of the second set is one which is perpendicular to the second axes of the planar region of the first set.

14. The solid state inductor of claim 13 wherein the semiconductor material is one selected from the group consisting of silicon, silicon carbide, germanium and gallium arsenide.

15. The solid state inductor of claim 14 wherein the material of the body is silicon having N-type conductivity, and
    the dopant impurity material is aluminum.

16. The solid state inductor coil of claim 13 wherein each region of second type conductivity of the coil has a rectangular-like cross-sectional configuration.

17. The solid state inductor coil of claim 13 wherein each region of second type conductivity of the the coil has a triangular-like cross-sectional configuration.

18. The solid state inductor of claim 17 wherein the semiconductor material is one selected from the group consisting of silicon, silicon carbide, germanium and gallium arsenide.

19. The solid state inductor of claim 18 wherein the material of the body is silicon having N-type conductivity, and
    the dopant impurity material is aluminum.

20. The solid state inductor coil of claim 12 in which the second crystal axis of each spaced planar isolation region of one set of regions is one selected from the group consisting of $<01\bar{1}>$, $<10\bar{1}>$ and $<1\bar{1}0>$, and
    the second crystal axis of each spaced planar region of the other set of regions is any other second crystal axis which is perpendicular to the crystal axis of the spaced planar regions of the other set with which they intersect.

21. The solid state inductor coil of claim 20 wherein each region of second type conductivity of the coil has a triangular-like cross-sectional configuration.

22. The solid state inductor of claim 20 wherein the semiconductor material is one selected from the group consisting of silicon, silicon carbide, germanium and gallium arsenide.

23. The solid state inductor of claim 22 wherein the material of the body is silicon having N-type conductivity, and
    the dopant impurity material is aluminum.

24. The solid state inductor of claim 21 wherein the semiconductor material is one selected from the group consisting of silicon, silicon carbide, germanium and gallium arsenide.

25. The solid state inductor of claim 24 wherein the material of the body is silicon having N-type conductivity, and
    the dopant impurity material is aluminum.

26. The solid state inductor coil of claim 14 in which the preferred planar crystal orientation of the at least one major surface is (100), the second crystal axis of each spaced planar region of one set of regions is <011>, and
the second crystal axis of each spaced planar region of the other set of regions is <0$\bar{1}$1>.

27. The solid state inductor of claim 26 wherein the semiconductor material is one selected from the group consisting of silicon, silicon carbide, germanium and gallium arsenide.

28. The solid state inductor of claim 27 wherein the material of the body is silicon having N-type conductivity, and
the dopant impurity material is aluminum.

* * * * *